US006861105B2

United States Patent
Veerasamy

(10) Patent No.: US 6,861,105 B2
(45) Date of Patent: Mar. 1, 2005

(54) METHOD OF MAKING AUTOMOTIVE TRIM WITH CHROMIUM INCLUSIVE COATING THEREON, AND CORRESPONDING AUTOMOTIVE TRIM PRODUCT

(75) Inventor: Vijayen S. Veerasamy, Ann Arbor, MI (US)

(73) Assignee: Guardian Industries Corp., Auburn Hills, MI (US)

( * ) Notice: Subject to any disclaimer, the term of this patent is extended or adjusted under 35 U.S.C. 154(b) by 165 days.

(21) Appl. No.: 10/174,568

(22) Filed: Jun. 18, 2002

(65) Prior Publication Data

US 2003/0232214 A1 Dec. 18, 2003

(51) Int. Cl.[7] ............................................... H05H 1/02
(52) U.S. Cl. ..................................... 427/570; 427/576
(58) Field of Search .................................. 427/570, 576

(56) References Cited

U.S. PATENT DOCUMENTS

| | | |
|---|---|---|
| 3,562,118 A | 2/1971 | Baier et al. |
| 3,620,804 A | 11/1971 | Bauer et al. |
| 3,650,914 A | 3/1972 | Lin |
| 3,865,699 A | 2/1975 | Luch |
| 4,036,707 A | 7/1977 | Januschkowetz et al. |
| 4,131,530 A | 12/1978 | Blum et al. |
| 4,374,717 A | 2/1983 | Drauglis et al. |
| 4,622,452 A | 11/1986 | Bergman et al. |
| 4,980,198 A | 12/1990 | Dowben et al. |
| 5,075,129 A | 12/1991 | Jackson et al. |
| 5,294,322 A | 3/1994 | Vetter et al. |
| 5,487,575 A | 1/1996 | Chase |
| 5,624,486 A * | 4/1997 | Schmid et al. ............... 106/404 |
| 5,703,173 A * | 12/1997 | Koloski et al. .......... 525/326.2 |
| 5,728,426 A | 3/1998 | Wei |
| 5,846,665 A | 12/1998 | Timmer et al. |
| 5,928,727 A | 7/1999 | Timmer |
| H1807 H | 10/1999 | Anderson, II |
| 5,962,073 A | 10/1999 | Timmer |
| 5,985,375 A | 11/1999 | Donohoe et al. |
| 6,040,077 A * | 3/2000 | Debe et al. ................... 429/40 |
| 6,139,964 A | 10/2000 | Sathrum et al. |
| 6,235,646 B1 | 5/2001 | Sharan et al. |
| 6,282,772 B1 | 9/2001 | McCormack |
| 6,294,227 B1 | 9/2001 | Anma et al. |
| 6,300,227 B1 | 10/2001 | Liu et al. |
| 6,319,438 B1 | 11/2001 | Smith et al. |
| 6,346,327 B1 | 2/2002 | Mokerji |
| 6,372,311 B2 | 4/2002 | McCormack |
| 6,399,152 B1 | 6/2002 | Goodrich |
| 6,531,221 B1 * | 3/2003 | Schuhmacher et al. ..... 428/402 |
| 2001/0053459 A1 | 12/2001 | Eerden et al. |

* cited by examiner

Primary Examiner—Bret Chen
(74) Attorney, Agent, or Firm—Nixon & Vanderhye P.C.

(57) ABSTRACT

A method is provided for making vehicle trim components that have a layer(s) including chromium (Cr), in metallic, oxide, nitride, and/or carbide form. In certain embodiments, a Cr inclusive gas is used in conjunction with a vapor deposition apparatus (e.g., PECVD apparatus) in order to form a Cr inclusive layer on a substrate. In certain example embodiments, the substrate may be provided with a conductive layer thereon, and may be electrically biased in the deposition chamber. The Cr inclusive layer may be at least partially amorphous in certain example embodiments.

22 Claims, 3 Drawing Sheets

METHOD OF MAKING AUTOMOTIVE TRIM WITH CHROMIUM INCLUSIVE COATING THEREON, AND CORRESPONDING AUTOMOTIVE TRIM PRODUCT

This invention relates to a method of making an automotive trim product including a chromium (Cr) inclusive layer provided thereon, and/or a corresponding automotive trim product. In certain example embodiments, Cr inclusive gas is used in a vapor deposition apparatus in order to deposit the Cr inclusive layer(s) onto a plastic substrate. In certain embodiments, this enables a scratch resistant Cr inclusive layer(s) to be deposited on a plastic substrate in an at least partially amorphous form. Automotive trim products discussed herein may be used in the context of cars, trucks, pick-up trucks, SUVs, and/or the like.

BACKGROUND OF THE INVENTION

Chrome-plated automotive trim products are known in the art. For example, see U.S. Pat. Nos. 6,282,772 and 6,372,311. In each of the '772 and '311 Patents, a vehicle bodyside molding is described as being chrome-plated using a technique in which the substrate is processed through one or more liquid/metal baths in order to effect the chrome-plating. Unfortunately, the use of a plurality of such baths in order to effect chrome plating of a vehicle component is sometimes not desirable in that the baths tend to be messy and can result in cross-contamination in certain instances.

In view of the above, it will be apparent to those skilled in the art that there exists a need in the art for an improved technique for manufacturing chrome-plated vehicle trim products (i.e., trim products having a coating including at least some Cr in metallic, oxide, nitride, and/or carbide form). There also exists a need in the art for a corresponding product that may be made using such a process.

BRIEF SUMMARY OF THE INVENTION

An improved process is provided for making vehicle trim components that have a layer including chromium (Cr), e.g., in metallic, oxide, nitride, and/or carbide form. In certain example embodiments of this invention, a Cr inclusive gas is used in conjunction with a vapor deposition apparatus (e.g., Plasma Enhanced Chemical Vapor Deposition apparatus—PECVD apparatus) in order to form a Cr inclusive layer on a substrate (e.g., polymer based substrate). In certain example embodiments, the substrate may be provided with a conductive layer thereon, and may be electrically biased in a deposition chamber. The Cr inclusive gas (the term "gas" as used herein includes vapor(s), and vice versa) is introduced into the chamber, and a plasma is struck. Glow discharge or the like occurs in the chamber. The biasing of the conductive layer on the substrate causes ions, including Cr ions, in the chamber to be drawn to the substrate and coat the same thereby forming the Cr inclusive layer thereon.

In certain example embodiments of this invention, the resulting Cr inclusive layer may be partially or entirely amorphous (i.e., non-crystalline). The providing of an at least partially amorphous Cr inclusive layer, and/or being deposited as discussed above, surprisingly enables the Cr inclusive layer to be scratch resistant while at the same time enabling desirable coloration to be achieved (e.g., chrome-like or dark-chrome-like coloration).

In certain example embodiments, the Cr inclusive layer may include other materials/elements including but not limited to oxygen, nitrogen, carbon, hydrogen, and/or the like.

In certain example embodiments of this invention, provided is a method of making an automotive trim product to be attached to a vehicle, the method comprising: providing a polymer inclusive substrate; coating the polymer inclusive substrate with at least one conductive layer to form a coated substrate; positioning the coated substrate in a vapor deposition chamber; vaporizing at least part of a liquid comprising chromium hexacarbonyl ($Cr(CO)_6$) so as to form a gas comprising Cr, and introducing the gas comprising Cr into the vapor deposition chamber; electrically biasing the coated substrate in the chamber and forming a plasma including Cr ions in the chamber, at least the Cr ions moving toward the coated substrate and forming at least one layer comprising Cr thereon; removing the coated substrate with the layer comprising Cr thereon from the vapor deposition chamber; and attaching the coated substrate to a vehicle as a trim product.

In other example embodiments of this invention, provided is a method of making an automotive trim product to be attached to a vehicle, the method comprising: providing a substrate; positioning the substrate in a vapor deposition chamber; introducing a gas comprising Cr into the vapor deposition chamber; forming a plasma including Cr ions in the vapor deposition chamber, at least the Cr ions of the plasma moving toward the substrate and forming at least one layer comprising Cr thereon; and removing the substrate with the layer comprising Cr thereon from the vapor deposition chamber.

In still further example embodiments of this invention provided is an automotive trim product comprising: a substrate; at least one conductive layer supported by the substrate; a layer comprising Cr formed on the substrate over the at least one conductive layer, the layer comprising Cr including at least one of chromium nitride, chromium carbide, chromium oxide, chromium oxynitride, chromium oxycarbide, and chromium carbide nitride.

DETAILED DESCRIPTION OF THE INVENTION

Figure 1:
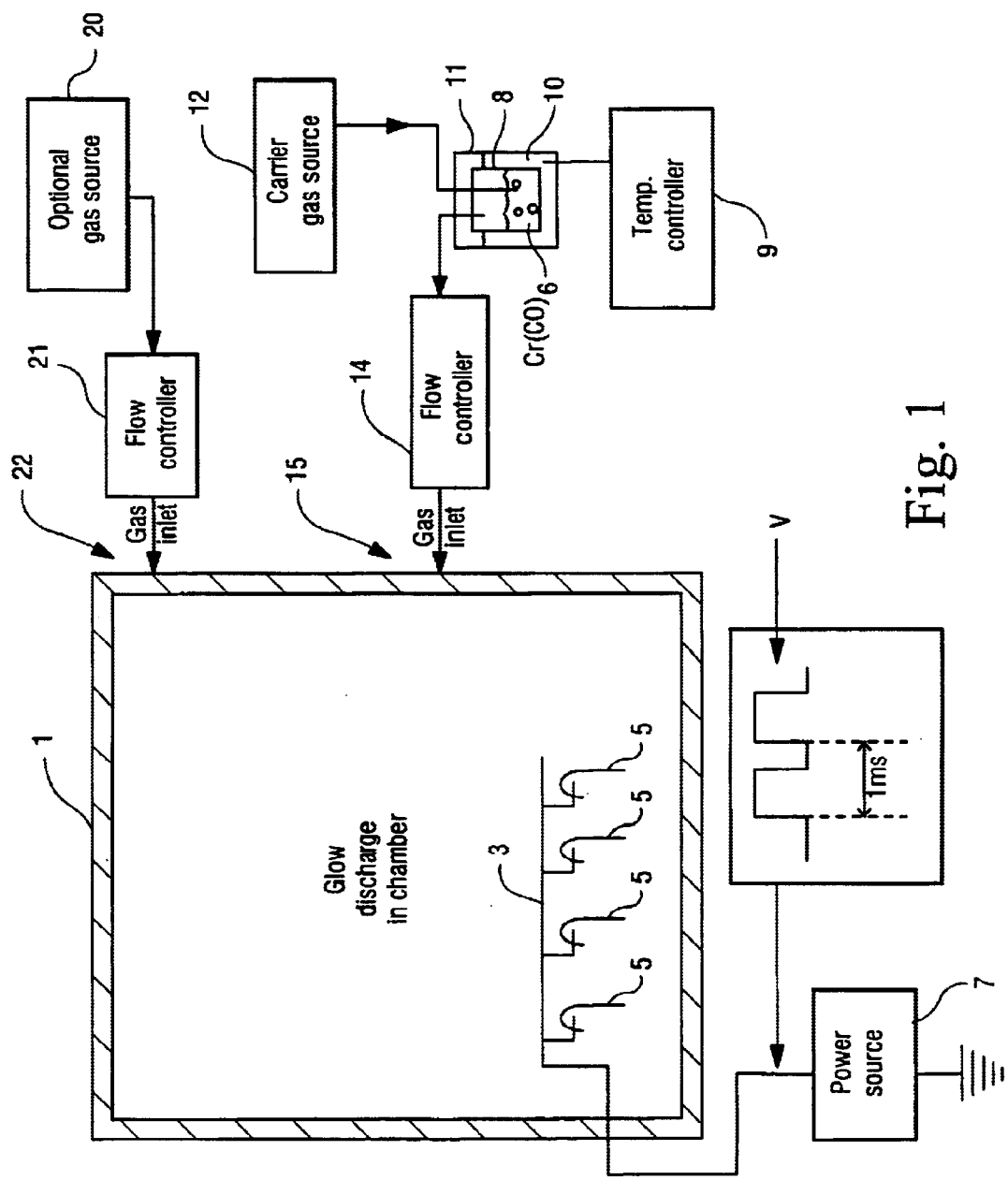
FIG. 1 is a schematic diagram illustrating an apparatus for depositing a Cr inclusive layer on a substrate in the manufacture of an automotive trim component according to an example embodiment of this invention.

Referring now more particularly to the accompanying drawings in which like reference numerals indicate like parts throughout the several views.

Figure 2:
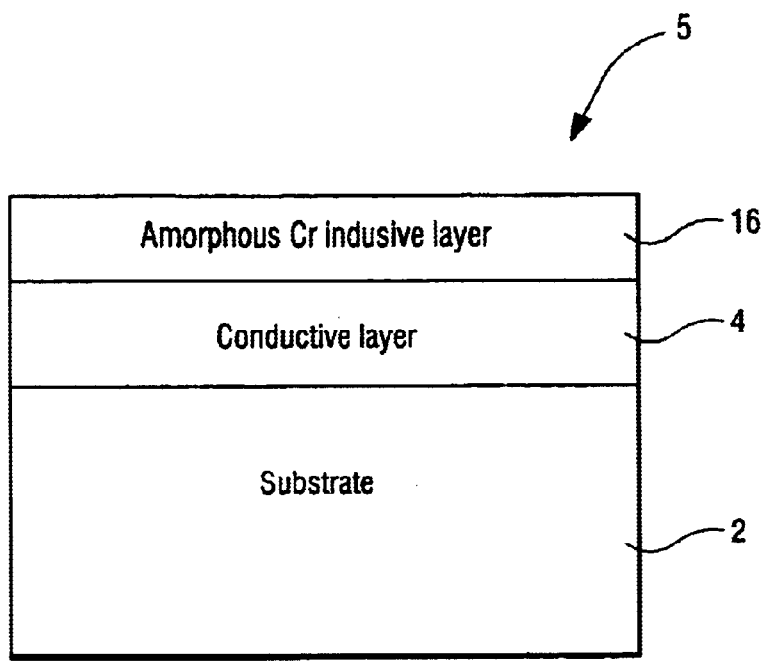
FIG. 2 is a cross sectional view of an automotive trim component according to an example embodiment of this invention.
Figure 3:
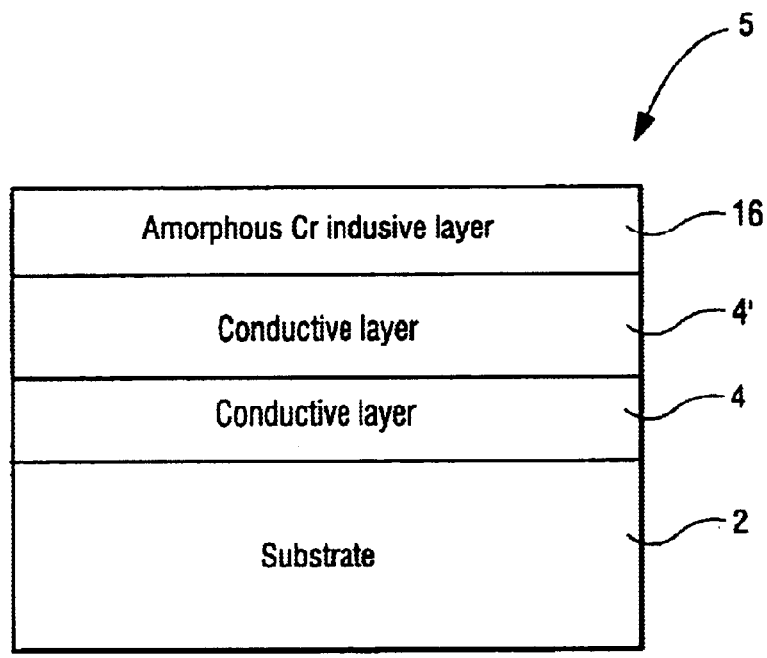
FIG. 3 is a cross sectional view of an automotive trim component according to another example embodiment of this invention.

FIG. 1 is a schematic diagram of a vapor deposition apparatus (e.g., PECVD apparatus) used in forming a chromium (Cr) inclusive layer(s) on a substrate in making an automotive trim product according to an example embodiment of this invention. FIGS. 2–3 are cross sectional view of portions of coated trim products according to different embodiments of this invention, while FIG. 4 is a flowchart illustrating certain steps taken in making trim product(s)

according to certain example embodiments of this invention. Automotive trim product(s) (e.g., bodyside molding, applique, door handle, wheel cover, fender, bumper, fascia, grill, bumper edging, etc.) are coated with the Cr inclusive layer(s) in vapor deposition chamber 1, and may be coated in the following manner according to one example embodiment of this invention. While a PECVD type coating apparatus is described herein and shown in the drawings, other types of deposition may instead be used (e.g., other types of plasma CVD, physical vapor deposition, cathodic arc vapor deposition—electric arc, etc.). Moreover, in certain optional embodiments of this invention, a coil (not shown) may be provided inside or outside of the chamber 1 in order to create an electric field that may help direct ions from a plasma toward substrate(s) to be coated.

Figure 4:
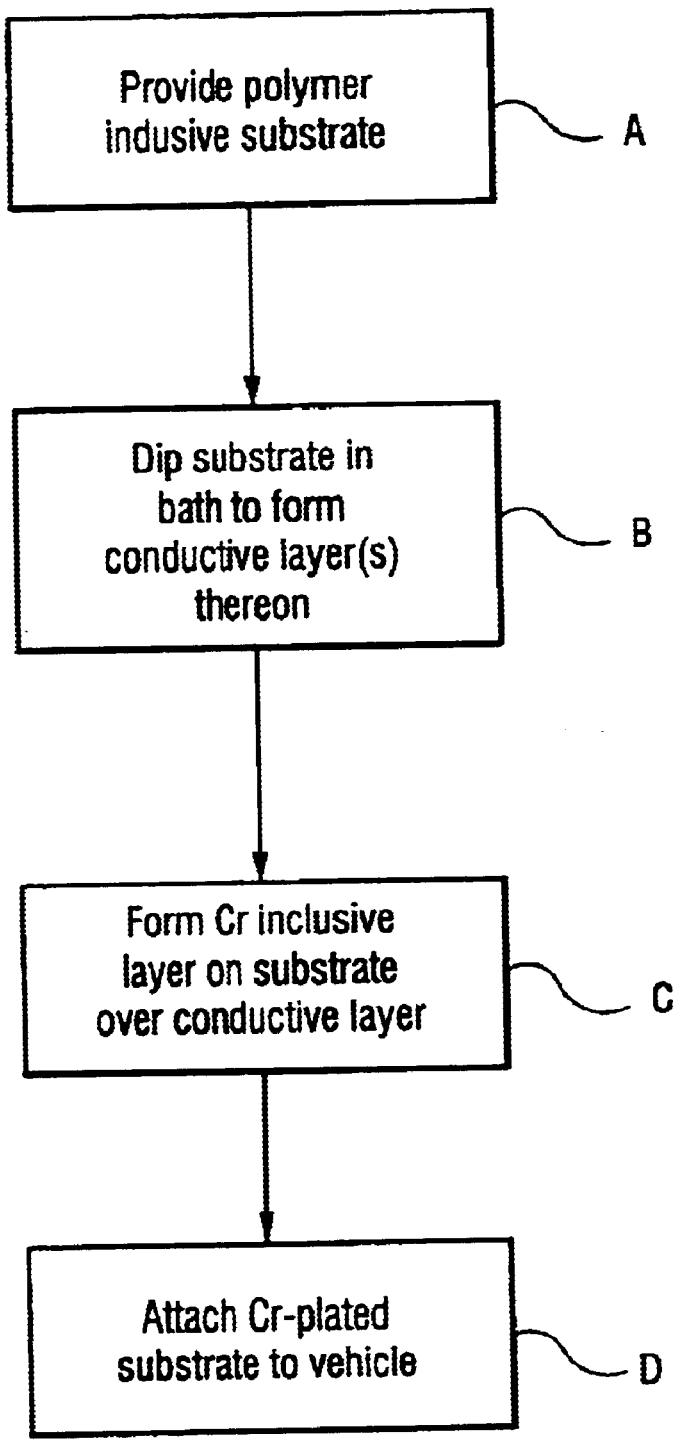
FIG. 4 is a flowchart illustrating steps taken in making an automotive trim component according to an example embodiment of this invention.

Referring to FIGS. 1–4, a substrate 2 (e.g., plastic substrate comprising a polymer such as ABS, polycarbonate, polyethylene, polypropylene, olefin, and/or the like) is provided (see step A in FIG. 4). When substrate 2 is of or includes ABS (acrylonitrile butadiene styrene), the ABS may include butadiene molecules intermixed in a styrene-acrylonitrile copolymer matrix. While substrate 2 is preferably polymer based in certain embodiments of this invention, it may be of other materials (e.g., glass or metal) in alternative embodiments of this invention.

Optionally, substrate 2 may be coated with one or more conductive layers 4 and/or 4' in certain embodiments of this invention. Other layers may also be provided. In certain embodiments, conductive layer(s) 4 and/or 4' may be of a conductive material such as a metal or metal alloy. For example, layer 4 may be of or include Ni, Cr, NiCr, Al or the like in certain example embodiments of this invention. Optional additional layer 4' may be of similar material(s) (e.g., Ni, Cr, NiCr, Al, etc.). Conductive layers 4 and/or 4' may be formed on substrate 2 by dipping the substrate into a bath(s) including the metal(s) in certain example embodiments of this invention (see step B in FIG. 4). The substrate 2 may be shaped (e.g., via injection molding, extrusion, vacuum-forming, or the like) into the desired vehicle trim shape either prior to or after coating with layer(s) 4 and/or 4'.

At least one substrate 2 (optionally with a conductive layer 4 and/or 4' thereon) is then positioned in vapor deposition chamber 1 (see final vehicle trim products 5—after coating—in chamber 1 in FIG. 1). In certain embodiments, the substrate(s) 2 may be supported by (e.g., hung from or otherwise supported by) a conductive support 3 located in the chamber 1. Support 3 may take the form or a rack, a bar(s), or any other suitable supporting structure in different embodiments of this invention. A biasing signal V from power source 7 is applied to the substrate(s) 2 in chamber 1, e.g., via conductive support 3 or in any other suitable manner. Since a conductive layer(s) 4 and/or 4' is provided on substrate 2, the signal V from power source is able to electrically bias the coated substrate(s) 2 in the chamber 1. Biasing signal V may be in the form of a square wave, sine wave, or any other suitable biasing signal in different embodiments of this invention. All coated substrates 2 in the chamber 1 may be electrically biased at the same time in the same manner in certain embodiments of this invention, while in other embodiments of this invention different coated substrates 2 in chamber 1 may be biased at different times so as to allow some coated substrates 2 to be coated during a first period of time and other coated substrates 2 to be coated during another period of time.

Cr inclusive gas is introduced into vapor deposition chamber 1 in the following manner in certain example embodiments of this invention. A Cr inclusive material such as $Cr(CO)_6$ (chromium hexacarbonyl) is provided in inner container 8. Since $Cr(CO)_6$ is a liquid at room temperature, it may be at least partially in liquid form at the bottom of inner container 8. Temperature controller 9 controls the temperature of a heating liquid (e.g., water) 10 provided in outer container 11 so as to surround at least a portion of inner container 8. When controller 9 heats liquid 10, it in turn causes the liquid $Cr(CO)_6$ to be heated (e.g., to about 70–100 degrees C.) thereby leading to vaporization of the same in inner container 8. At least one carrier gas (e.g., Ar, $N_2$ and/or a hydrocarbon such as $C_2H_2$) from source 12 may flow into container 11. The carrier gas together with Cr inclusive gas from the vaporized $Cr(CO)_6$ flows into chamber 1 via gas inlet 15. Flow controller 14 is capable of controlling the flow rate of the gas(es) into the chamber 1. Thus, gas including Cr, N, C, H, and/or Ar (or any other suitable materials) flows into vapor deposition chamber 1 at inlet 15. Optionally, another gas source 20 may be provided in order to enable another gas (e.g., $NH_3$, or any other suitable gas(es)) to be introduced into chamber 1 via flow controller 21 and inlet 22. Optionally, a heater (not shown) may be provided in or around chamber 1 in order to heat the interior of the same.

Since the coated substrate(s) 2 is/are electrically biased (e.g., negative biasing with DC), a glow discharge is generated (e.g., between the biased substrates and the wall of chamber 1). A plasma is thereby generated in the chamber, due to the presence of the gas and the biased coated substrate(s). In view of the aforesaid gas combination, the plasma includes ions such as $Cr^{3+}$, $N^+$, $O^+$ and/or $C^+$. Other ions may also be present in certain embodiments. While in chamber 1, the coated substrate(s) may or may not be heated in different embodiments of this invention. The electrical biasing of the coated substrate(s) 2 causes ions (e.g., $Cr^{3+}$, $N^+$, $O^+$ and/or $C^+$ ions) to be drawn toward and onto the coated substrate(s) 2 so as to coat the same with Cr inclusive layer 16 (see step C in FIG. 4). In such a manner, Cr inclusive layer 16 is formed on substrate 2 over conductive layer(s) 4 and/or 4' so as to form the vehicle trim product 5 (see FIGS. 2–3). The chamber 1 may in some example instances be evacuated before and/or while the plasma is struck in certain embodiments of this invention.

After coated trim products 5 are removed from the deposition chamber 1, they may or may not be further processed (e.g., polished, shaped, etc.), and may then be attached to a vehicle in a known manner (see step D in FIG. 4).

When the aforesaid gases are used, the plasma in vapor deposition chamber 1 may include ions such as $Cr^{3+}$, $N^+$, $O^+$ and/or $C^+$ ions. In such cases, the resulting vapor deposited layer 16 formed in chamber 1 includes Cr. Additionally, the layer may also include one or more of N, O and C. Thus, vapor deposited layer 16 may comprise chromium nitride, chromium carbide, chromium oxide, chromium oxynitride, chromium oxycarbide, and/or chromium carbide nitride in certain example embodiments of this invention. In certain embodiments of this invention, layer 16 includes from about 20–100% Cr (more preferably from about 20–90% Cr, even more preferably from about 25–80% Cr, and still more preferably from about 30–70% Cr), from about 0–75% C (more preferably from about 5–60% C, even more preferably from about 5–30% C), from about 0–40% O (even more preferably from about 1–40% O, and most preferably from about 5–20% O), and from about 0–40% N (more preferably from about 1–35% N, even more preferably from about 4–30% N). Other elements/materials such as H (e.g., from 0–25%, possibly from 1–20%) may also be included in layer 16 in certain embodiments of this invention. The percentages above are atomic %.

The presence of layer 16 provides a chrome-like or dark-chrome like coloration/appearance to the trim product. In dark-chrome embodiments, which are preferred in many instances, the visual appearance comprises a shiny metallic-looking finish that is not quite bright silver but instead is more of a charcoal-like color. In other words, in dark-chrome embodiments, the color of the trim product is on the charcoal side of conventional bright metallic chrome. In certain instances, the dark-chrome may have significant reflection to an extent so that for example a person could see himself/herself via a reflection therefrom in ambient atmospheric conditions. This is advantageous in certain instances, as it is difficult to otherwise obtain such coloration/appearance in an efficient and cost-effective manner.

In certain alternative embodiments of this invention, the substrate 2 may be Ni plated in chamber 1 instead of Cr plated, in the manner discussed above using Ni inclusive gas. Moreover, the $Cr(CO)_6$ liquid to be vaporized is provided for purposes of example, and is not intended to be limiting unless specifically claimed.

In certain example embodiments of this invention, layer 16 may be provided at a thickness of from about 0.5 to 50 $\mu$m, more preferably from about 1 to 25 $\mu$m.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. A method of making an automotive trim product to be attached to a vehicle, the method comprising:

providing a polymer inclusive substrate;

coating the polymer inclusive substrate with at least one conductive layer to form a coated substrate;

positioning the coated substrate in a vapor deposition chamber;

vaporizing at least part of a liquid comprising chromium hexacarbonyl ($Cr(CO)_6$) so as to form a gas comprising Cr, and introducing the gas comprising Cr into the vapor deposition chamber;

electrically biasing the coated substrate in the chamber and forming a plasma including Cr ions in the chamber, at least the Cr ions moving toward the coated substrate and forming at least one layer comprising Cr thereon;

removing the coated substrate with the layer comprising Cr thereon from the vapor deposition chamber; and attaching the coated substrate to a vehicle as a trim product.

2. The method of claim 1, further comprising shaping the polymer inclusive substrate in a shape of the automotive trim product prior to coating the substrate with the at least one conductive layer, and wherein the layer comprising Cr further comprises carbon (C).

3. The method of claim 2, further comprising shaping at least the substrate in a shape of an automotive trim product, and wherein the layer comprising Cr is at least partially amorphous.

4. The method of claim 1, wherein the layer comprising Cr comprises at least one of: chromium nitride, chromium carbide, chromium oxide, chromium oxynitride, chromium oxycarbide, and chromium carbide nitride.

5. The method of claim 1, wherein the gas comprising Cr introduced into the vapor deposition chamber further comprises carbon so that the layer comprising Cr comprises chromium carbide.

6. The method of claim 1, wherein the gas comprising Cr introduced into the vapor deposition chamber further comprises hydrogen.

7. The method of claim 1, wherein the gas comprising Cr introduced into the vapor deposition chamber further comprises oxygen and/or nitrogen.

8. The method of claim 1, wherein the gas comprising Cr introduced into the vapor deposition chamber further comprises argon.

9. The method of claim 1, wherein the gas comprising Cr introduced into the vapor deposition chamber further comprises at least two of carbon, hydrogen, argon, oxygen and nitrogen.

10. The method of claim 1, wherein the gas comprising Cr introduced into the vapor deposition chamber further comprises at least three of carbon, hydrogen, argon, oxygen and nitrogen.

11. The method of claim 1, wherein the gas comprising Cr introduced into the vapor deposition chamber further comprises at least four of carbon, hydrogen, argon, oxygen and nitrogen.

12. The method of claim 1, wherein the layer comprising Cr is substantially amorphous.

13. The method of claim 1, wherein the substrate comprises acrylonitrile butadiene styrene.

14. The method of claim 1, wherein the trim product is made so that it has dark chrome coloration, wherein said dark chrome coloration is on the charcoal side of conventional bright metallic chrome.

15. A method of making an automotive trim product to be attached to a vehicle, the method comprising:

providing a substrate;

positioning the substrate in a vapor deposition chamber;

introducing a gas comprising Cr into the vapor deposition chamber;

forming a plasma including Cr ions in the vapor deposition chamber, at least the Cr ions of the plasma moving toward the substrate and forming at least one layer comprising Cr thereon; and removing the substrate with the layer comprising Cr thereon from the vapor deposition chamber.

16. The method of claim 15, wherein the layer comprising Cr comprises at least one of: chromium nitride, chromium carbide, chromium oxide, chromium oxynitride, chromium oxycarbide, and chromium carbide nitride.

17. The method of claim 15, wherein the gas comprising Cr introduced into the vapor deposition chamber further comprises carbon so that the layer comprising Cr further comprises carbon (C).

18. The method of claim 15, wherein the gas comprising Cr introduced into the vapor deposition chamber further comprises oxygen and/or nitrogen.

19. The method of claim 15, wherein the gas comprising Cr introduced into the vapor deposition chamber further comprises at least three of carbon, hydrogen, argon, oxygen and nitrogen.

20. The method of claim 15, wherein the substrate comprises acrylonitrile butadiene styrene.

21. The method of claim 15, wherein the trim product is made so that it has dark chrome coloration, wherein said dark chrome coloration is on the charcoal side of conventional bright metallic chrome.

22. The method of claim 15, wherein the layer comprising Cr comprises chromium carbide.

* * * * *